(12) United States Patent
Huang et al.

(10) Patent No.: US 8,003,480 B2
(45) Date of Patent: Aug. 23, 2011

(54) PROCESS USING OXIDE SUPPORTER FOR MANUFACTURING A CAPACITOR LOWER ELECTRODE OF A MICRO STACKED DRAM

(75) Inventors: Shin Bin Huang, Hsinchu County (TW); Ching-Nan Hsiao, Kaohsiung County (TW); Chung-Lin Huang, Taoyuan County (TW)

(73) Assignee: Inotera Memories, Inc., Taoyuan County (TW)

( * ) Notice: Subject to any disclaimer, the term of this patent is extended or adjusted under 35 U.S.C. 154(b) by 24 days.

(21) Appl. No.: 12/700,796

(22) Filed: Feb. 5, 2010

(65) Prior Publication Data

US 2011/0081763 A1    Apr. 7, 2011

(30) Foreign Application Priority Data

Oct. 7, 2009    (TW) ................................ 98133962 A

(51) Int. Cl.
*H01L 21/20* (2006.01)
(52) U.S. Cl. ........ 438/396; 438/253; 438/381; 438/700; 257/E21.011; 257/E21.646; 257/E21.651

(58) Field of Classification Search .................. 438/190, 438/329; 257/E21.014, E21.017, E21.35, 257/E21.351
See application file for complete search history.

(56) References Cited

U.S. PATENT DOCUMENTS

| | | | |
|---|---|---|---|
| 7,666,797 B2* | 2/2010 | Shea et al. ................. 438/744 |
| 2007/0098892 A1* | 5/2007 | Chung et al. ............. 427/248.1 |

* cited by examiner

*Primary Examiner* — Cheung Lee
(74) *Attorney, Agent, or Firm* — Rosenberg, Klein & Lee

(57) ABSTRACT

A process using oxide supporter for manufacturing a capacitor lower electrode of a micron stacked DRAM is disclosed. First, form a stacked structure. Second, form a photoresist layer on an upper oxide layer and then etch them. Third, deposit a polysilicon layer onto the upper oxide layer and the nitride layer. Fourth, deposit a nitrogen oxide layer on the polysilicon layer and the upper oxide layer. Sixth, partially etch the nitrogen oxide layer, the polysilicon layer and the upper oxide layer to form a plurality of vias. Seventh, oxidize the polysilicon layer to form a plurality of silicon dioxides surround the vias. Eighth, etch the nitride layer, the dielectric layer and the lower oxide layer beneath the vias. Ninth, form a metal plate and a capacitor lower electrode in each of the vias. Tenth, etch the nitrogen oxide layer, the polysilicon layer, the nitride layer and the dielectric layer.

14 Claims, 9 Drawing Sheets

PROCESS USING OXIDE SUPPORTER FOR MANUFACTURING A CAPACITOR LOWER ELECTRODE OF A MICRO STACKED DRAM

BACKGROUND OF THE INVENTION

1. Field of the Invention

The present invention relates to a process for manufacturing a capacitor lower electrode. In particular, the present invention relates to a process for manufacturing a capacitor lower electrode of a micro stacked DRAM.

2. Description of Related Art

Please refer to FIGS. 1-5, a manufacturing process of a prior capacitor lower electrode of DRAM is described. First, provide a semiconductor substrate 1a with a lot of MOSFET (not shown in drawings) and conductor plugs 11a. The conductor plugs 11a are electrically connected to the drain or source of the MOSFET. Second, form a stacked structure 2a on the semiconductor substrate 1a. The stacked structure 2a includes an oxide layer 21a, a dielectric layer 22a, and a nitride layer 23a from bottom to top. The oxide layer 21a, the dielectric layer 22a, and the nitride layer 23a have different etching speed. As shown in FIG. 3, after form the stacked structure 2a, form a plurality of vias 24a via a photolithography process to make the conductor plugs 11a be exposed to the vias 24a. Third, put a metal plate 25a in each of the vias 24a. The metal plates 25a contact to the conductor plugs 11a. Fourth, form a capacitor lower electrode 26a in each of the vias 24a. Each of the capacitor lower electrodes 26a is formed as U shape in the sectional view thereof. The capacitor lower electrodes 26a are disposed on the metal plates 25a. Fifth, partially etch the nitride layer 23a and the capacitor lower electrodes 26a (as shown in FIGS. 1 and 4, the process is named "25 lattice etch") to form an etching area 27a with an oval-shaped, and then etch the dielectric layer 22a via the etching area 27a (as shown in FIG. 5).

In order to improve the data capacity of DRAM, the density of the memory cells need to increased. Generally, the way to increase the density of the memory cells is to reduce the size of the capacitor lower electrodes 26a or increase the surface area of the capacitor lower electrodes 26a. As a result, it becomes hard to manufacture the capacitor lower electrodes 26a because of the small size of the capacitor lower electrodes 26a. The supporting force of capacitor lower electrodes 26a becomes weak such as to topple while disposing a capacitor dielectric layer and a capacitor upper electrode onto each of the capacitor lower electrodes 26a. Furthermore, after forming the etching area 27a, each of the capacitor lower electrodes 26a has different shapes, therefore it will influence the electrical property of capacitor.

SUMMARY OF THE INVENTION

One particular aspect of the present invention is to provide a process for manufacturing a capacitor lower electrode of a micro stacked DRAM, it can increase the supporting force of capacitor lower electrode, reduce the difficulty of disposing a capacitor dielectric layer and a capacitor upper electrode on the capacitor lower electrode, and prevent toppling of the capacitor lower electrode.

The process for manufacturing a capacitor lower electrode of a micro stacked DRAM is described. First, form a stacked structure. Second, form a photoresist layer on an upper oxide layer and then etch them. Third, deposit a polysilicon layer onto the upper oxide layer and the nitride layer. Fifth, deposit a nitrogen oxide layer on the polysilicon layer and the upper oxide layer. Sixth, partially etch the nitrogen oxide layer, the polysilicon layer and the upper oxide layer to form a plurality of vias. Seventh, oxidize the polysilicon layer to form a plurality of silicon dioxides surround the vias. Eighth, etch the nitride layer, the dielectric layer and the lower oxide layer beneath the vias. Ninth, form a metal plate and a capacitor lower electrode in each of the vias. Tenth, etch the nitrogen oxide layer, the polysilicon layer, the nitride layer and the dielectric layer.

The present invention has the following characteristics.

1. The polysilicon layer surround the vias is oxidized to form the silicon dioxides, the silicon dioxides are the supporter of the capacitor lower electrodes, so that the supporting force of the capacitor lower electrodes is increased, the difficulty of disposing a capacitor dielectric layer and a capacitor upper electrode on the capacitor lower electrode is reduced, and it can prevent toppling of the capacitor lower electrode.

2. Because forming the etching area during the prior process would destroy the shape of the capacitor lower electrodes, but there is no etching area formed during the process of the present invention, so that each of capacitor lower electrodes has the same shape and electrical property.

For further understanding of the present invention, reference is made to the following detailed description illustrating the embodiments and examples of the present invention. The description is for illustrative purpose only and is not intended to limit the scope of the claim.

DETAILED DESCRIPTION OF THE PREFERRED EMBODIMENTS

Figure 1:
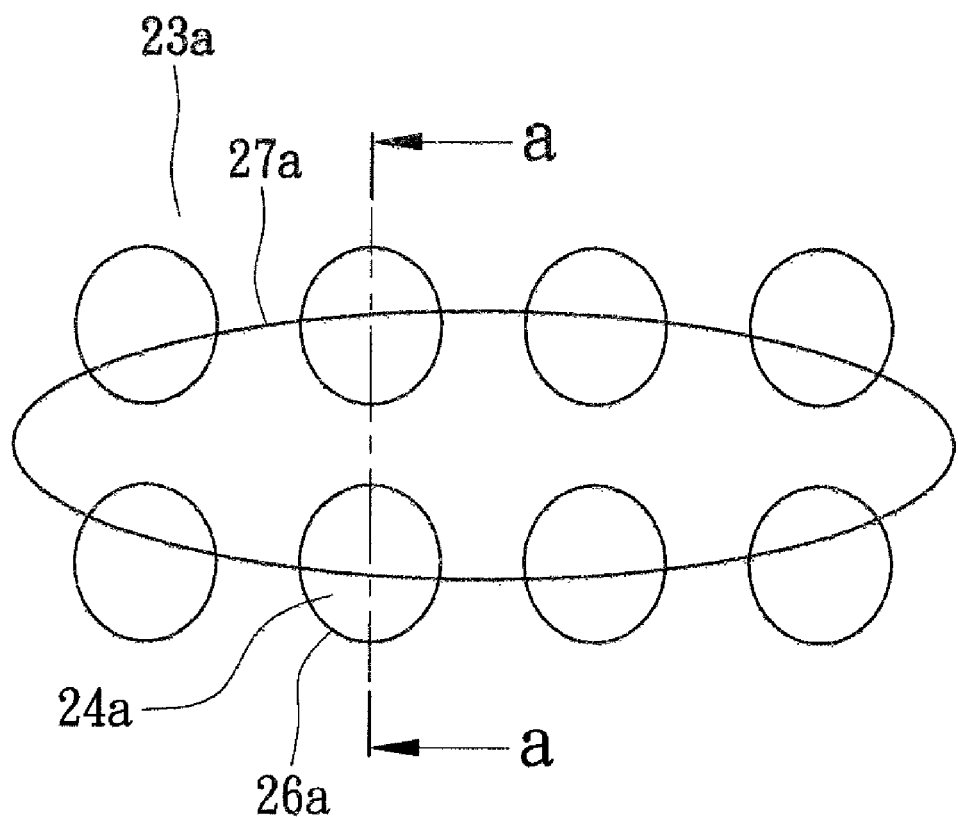
FIG. 1 is a top view of the capacitor lower electrode of the prior art.
Figure 2:
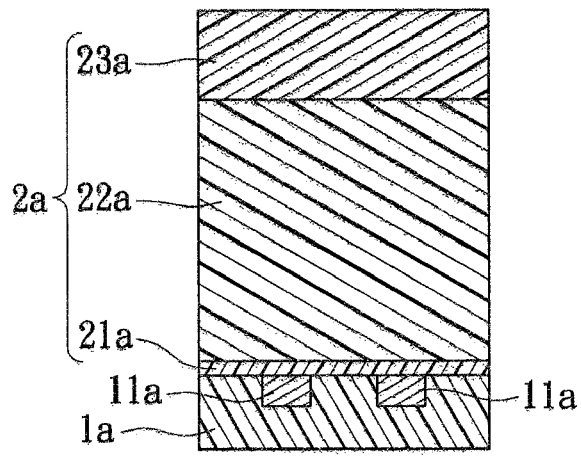
FIG. 2 is a sectional view of a-a section line of FIG. 1 showing the process for manufacturing the capacitor lower electrode.
Figure 3:
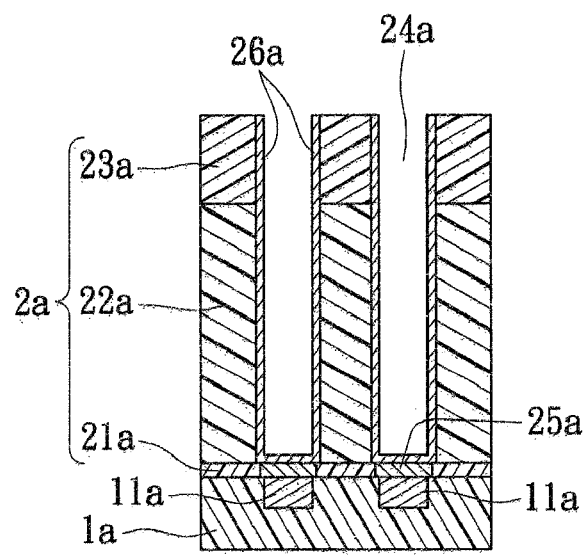
FIG. 3 is a sectional view of a-a section line of FIG. 1 showing the process for manufacturing the capacitor lower electrode.
Figure 4:
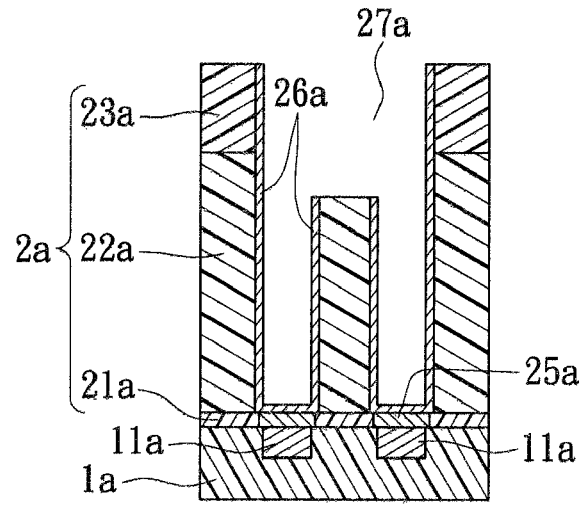
FIG. 4 is a sectional view of a-a section line of FIG. 1 showing the process for manufacturing the capacitor lower electrode.
Figure 5:
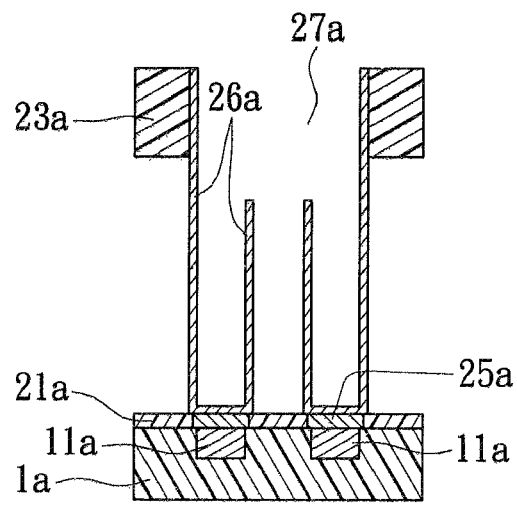
FIG. 5 is a sectional view of a-a section line of FIG. 1 showing the process for manufacturing the capacitor lower electrode.
Figure 6:
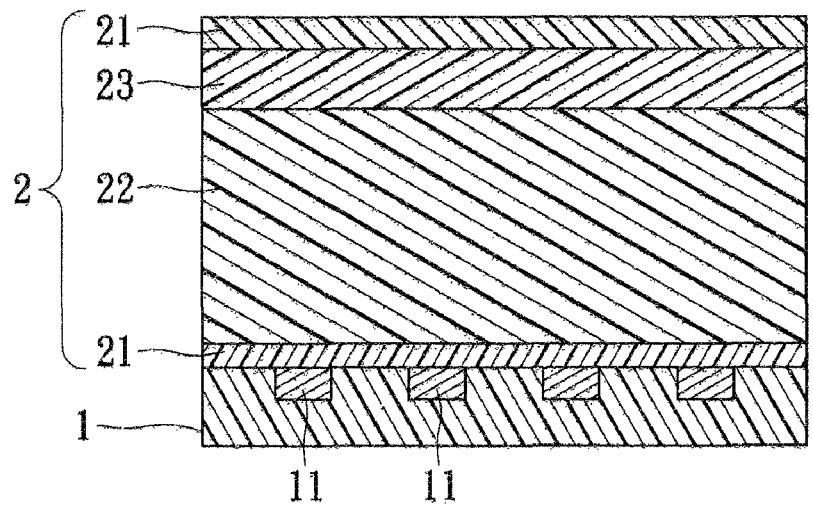
FIG. 6 is a sectional view showing the process for manufacturing the capacitor lower electrode of the present invention.

Reference is made to FIGS. 6-16, a process for manufacturing a capacitor lower electrode of a micro stacked DRAM is described. Please refer to FIG. 6. First, a stacked structure 2 is formed on a semiconductor substrate 1. The semiconductor substrate 1 has a plurality of conductor plugs 11 which are made of polysilicon and a plurality of drains or sources (not shown in FIGS.) which are electrically connected to the conductor plugs 11.

The stacked structure 2 comprises two oxide layer 21, a dielectric layer 22, and a nitride layer 23. The dielectric layer 22 is disposed between the two oxide layer 21. The nitride layer 23 is disposed on the dielectric layer 22. In this embodiment, the dielectric layer 22 is made of phosphor silicate glass (PSG). The nitride layer 23 is made of nitride silicon (SiN).

Figure 7:
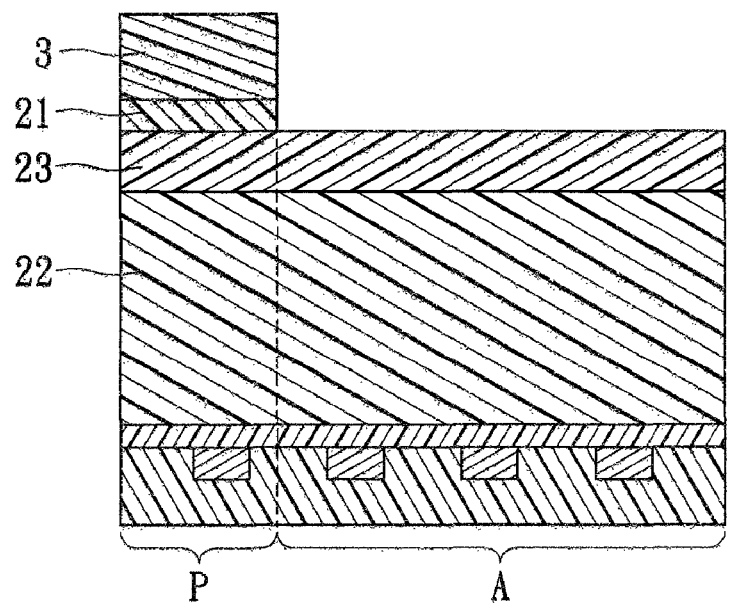
FIG. 7 is a sectional view showing the process for manufacturing the capacitor lower electrode of the present invention.

Please refer to FIG. 7. Second, a photoresist layer 3 is formed on the upper oxide layer 21. At the same time, the stacked structure 2 is labeled as an array area A and a periphery area P. The array area A is named capacitor area. The periphery area P has many circuits (not shown in FIGS.). Then, partially etch the photoresist layer 3 and the upper oxide layer 21. During partially etching the photoresist layer 3 and the upper oxide layer 21, the photoresist layer 3 and the upper oxide layer 21 in an array area A are etched first, and then the photoresist layer 3 in a peripheral area P is etched.

Figure 8:
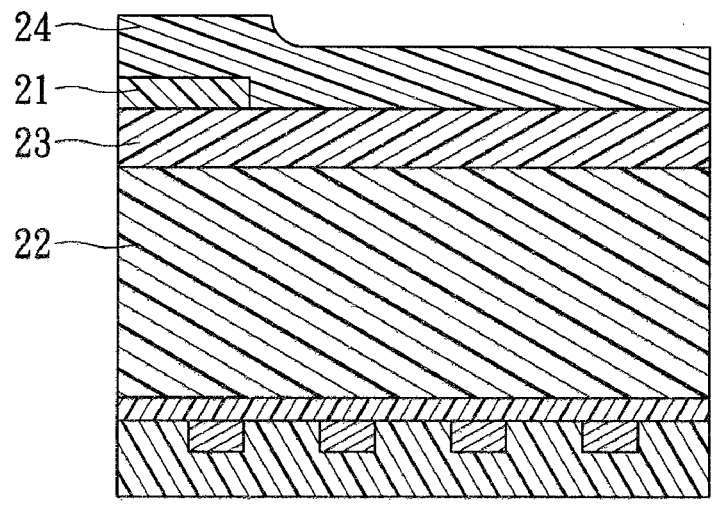
FIG. 8 is a sectional view showing the process for manufacturing the capacitor lower electrode of the present invention.

Please refer to FIG. 8. Third, deposit a polysilicon layer 24 on the upper oxide layer 21 and the nitride layer 23.

Figure 9:
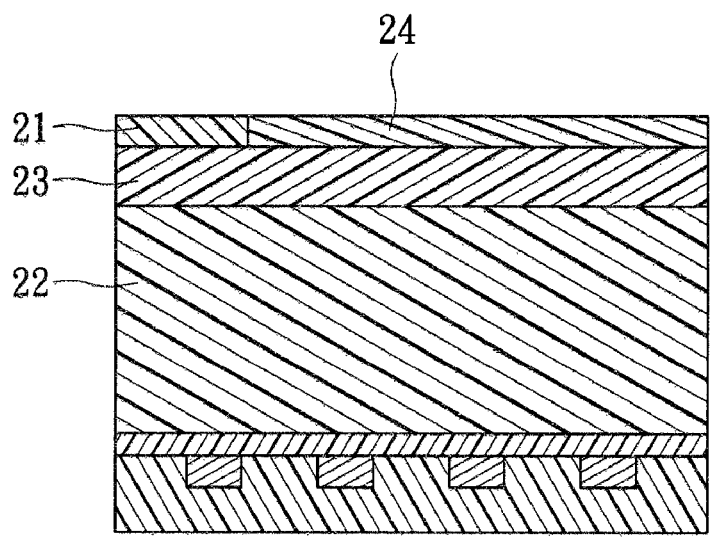
FIG. 9 is a sectional view showing the process for manufacturing the capacitor lower electrode of the present invention.

Please refer to FIG. 9. Fourth, polish the polysilicon layer 24 by chemical mechanical polishing (CMP) to make it and the upper oxide layer 21 have the same level.

Figure 10:
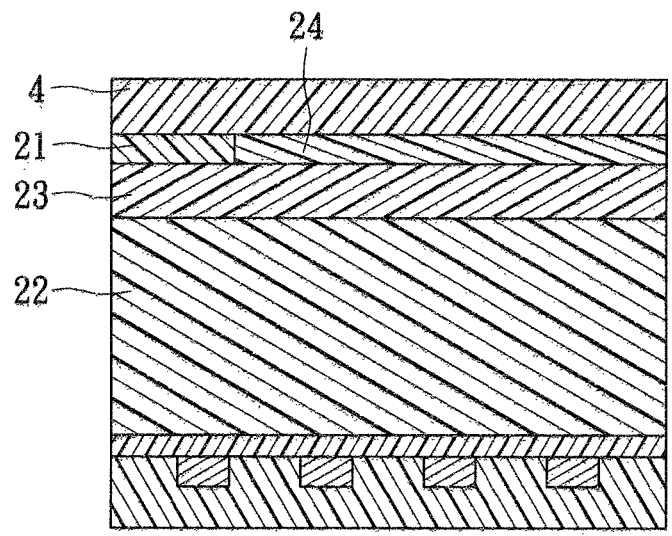
FIG. 10 is a sectional view showing the process for manufacturing the capacitor lower electrode of the present invention.

Please refer to FIG. 10. Fifth, deposit a nitrogen oxide layer 4 on the polysilicon layer 24 and the upper oxide layer 21. In this embodiment, the nitrogen oxide layer 4 is made of silicon oxynitride (SiON).

Figure 11:
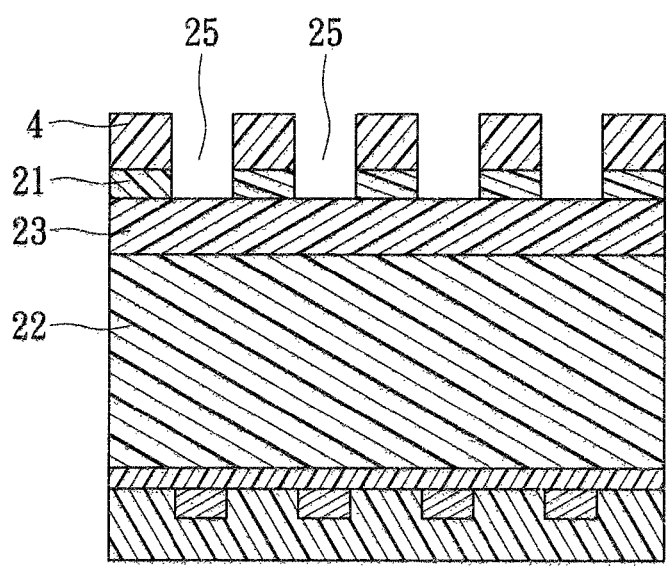
FIG. 11 is a sectional view showing the process for manufacturing the capacitor lower electrode of the present invention.

Please refer to FIG. 11. Sixth, partially etch the nitrogen oxide layer 4, the polysilicon layer 24 and the upper oxide layer 21 to form a plurality of vias 25 arrayed with an interval. During forming the vias 25, the vias 25 are located via a photolithography process (42 photo) first, and then via a plasma etching process (HM etch). The depth of the vias 25 can be extended to the top surface of the nitride layer 23 by controlling the etching time.

Figure 12:
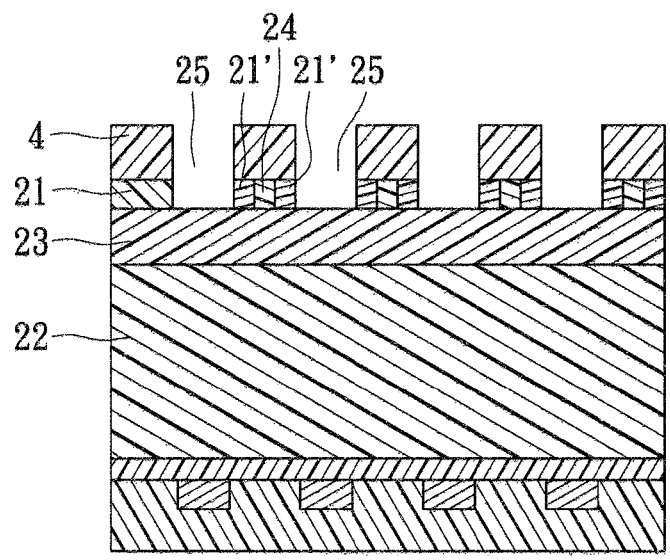
FIG. 12 is a sectional view showing the process for manufacturing the capacitor lower electrode of the present invention.

Please refer to FIG. 12. Seventh, oxidize the polysilicon layer 24 via an annealing process to form a plurality of silicon dioxides 21' surround the vias 25. The silicon dioxides 21' are formed from the surface of the polysilicon layer 24 which is exposed to the vias 25.

Figure 13:
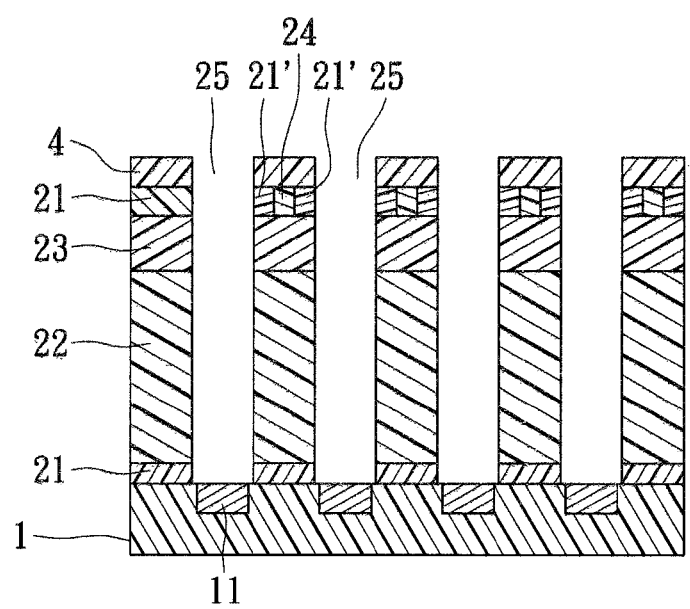
FIG. 13 is a sectional view showing the process for manufacturing the capacitor lower electrode of the present invention.

Please refer to FIG. 13. Eighth, etch the nitride layer 23, the dielectric layer 22 and the lower oxide layer 21 beneath the vias 25, the nitride layer 23, the dielectric layer 22 and the lower oxide layer 21 out of the vias 25 are reserved. The conductor plugs 11 are exposed to the vias 25.

Figure 14:
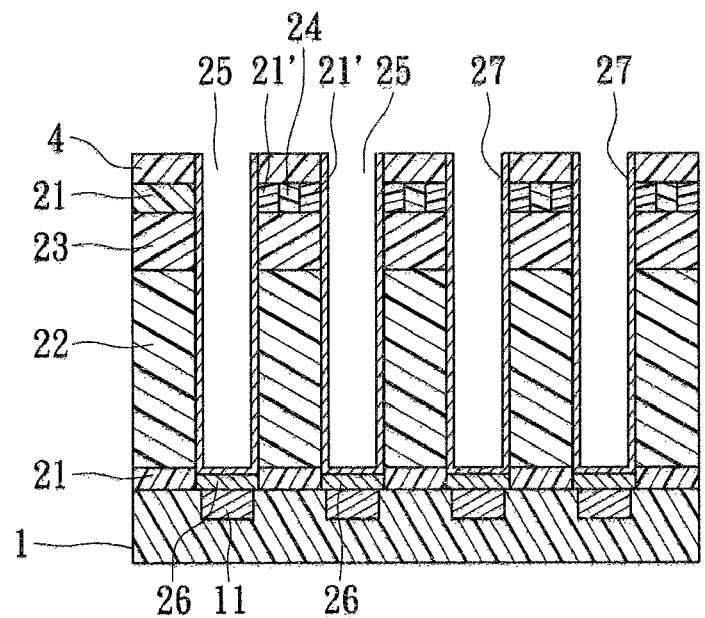
FIG. 14 is a sectional view showing the process for manufacturing the capacitor lower electrode of the present invention.

Please refer to FIG. 14. Ninth, form a metal plate 26 and a capacitor lower electrode 27 in each of the vias 25. The metal plates 26 are disposed on the conductor plugs 11. The metal plates 26 are titanium metal plates. The bottom of the metal plates 26 are electrically connected to the conductor plugs 11 by contacting. The capacitor lower electrodes 27 are made of titanium nitride. The capacitor lower electrodes 27 are formed as cylinders and U shape in the sectional view thereof. The capacitor lower electrodes 27 are attached to the wall of the vias 25, and the bottom of the capacitor lower electrodes 27 are electrically connected to the metal plates 26 by contacting.

Figure 15:
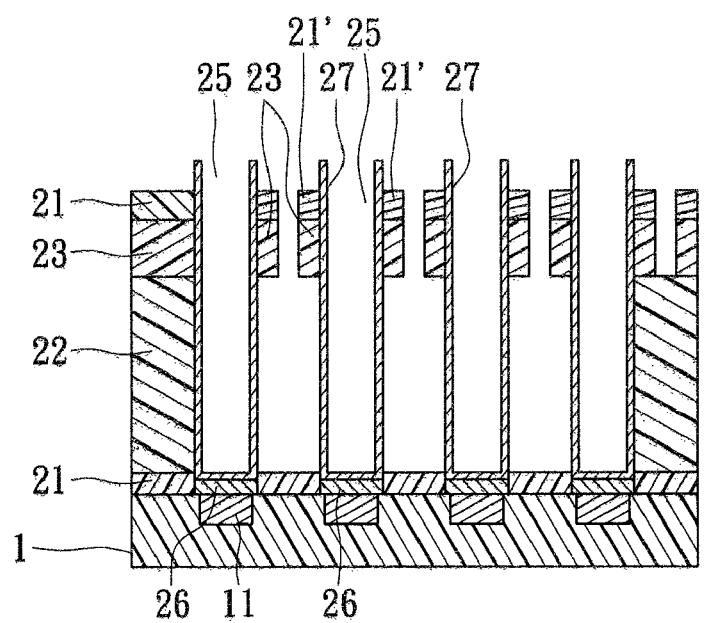
FIG. 15 is a sectional view showing the process for manufacturing the capacitor lower electrode of the present invention.
Figure 16:
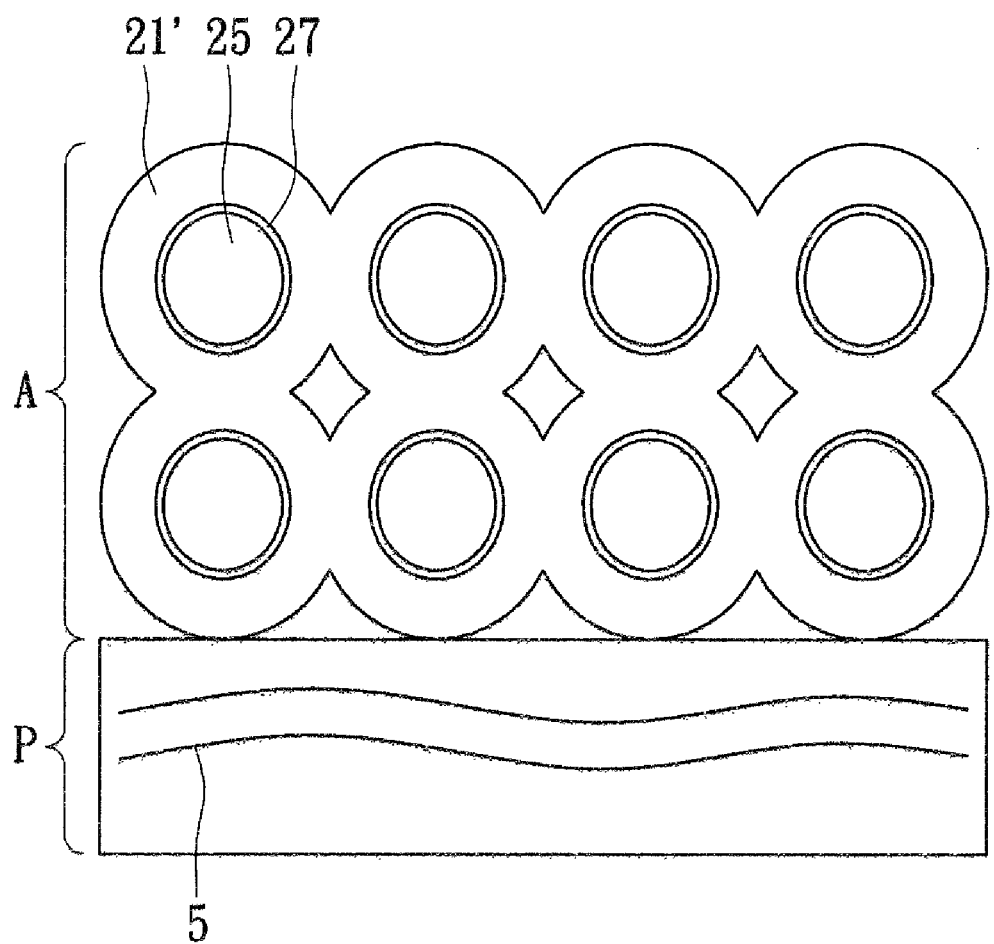
FIG. 16 is a top view of the present invention.

Please refer to FIG. 15. Tenth, etch the nitrogen oxide layer 4, the polysilicon layer 24, certain portions of the nitride layer 23 and the dielectric layer 22 which is under the nitride layer 23 in turn, so that each of capacitor lower electrodes 27 is surrounded and adhered with the silicon dioxides 21' and the remained nitride layer 23 to increase the supporting force of the capacitor lower electrodes 27.

It's mentionable that before etch the dielectric layer 22 under the nitride layer 23, further comprises form a moat 5 in the peripheral area P to prevent the etching liquid from etching out and destroy the circuits in the peripheral area P.

The present invention has the following characteristics.

1. Each of capacitor lower electrodes 27 is surrounded and adhered with the silicon dioxides 21' and the nitride layer 23, the silicon dioxides 21' is on the nitride layer 23, so that the supporting force of the capacitor lower electrodes 27 is increased, the difficulty of disposing a capacitor dielectric layer (not shown in FIGS.) and a capacitor upper electrode (not shown in FIGS.) on the capacitor lower electrode is reduced, and it can prevent toppling of the capacitor lower electrode.

2. Compare to the prior process of the capacitor lower electrodes, there is no etching area formed during the process of the present invention, so that each of capacitor lower electrodes has the same shape and electrical property.

The description above only illustrates specific embodiments and examples of the present invention. The present invention should therefore cover various modifications and variations made to the herein-described structure and operations of the present invention, provided they fall within the scope of the present invention as defined in the following appended claims.

What is claimed is:

1. A process using oxide supporter for manufacturing a capacitor lower electrode of a micron stacked DRAM, comprising:

forming a stacked structure on a semiconductor substrate, wherein the semiconductor substrate has a plurality of conductor plugs, the stacked structure includes an upper oxide layer, a lower oxide layer, a dielectric layer, and a nitride layer, the dielectric layer and the nitride layer are between the upper oxide layer and the lower oxide layer, the nitride layer is on the dielectric layer;

forming a photoresist layer on the upper oxide layer, partially etching the photoresist layer and the upper oxide layer;

depositing a polysilicon layer on the upper oxide layer and the nitride layer;

depositing a nitrogen oxide layer on the polysilicon layer and the upper oxide layer;

partially etching the nitrogen oxide layer, the polysilicon layer and the upper oxide layer to form a plurality of vias;

oxidizing the polysilicon layer converting the polysilicon layer to silicon dioxide surrounding the vias;

etching the nitride layer, the dielectric layer and the lower oxide layer beneath the vias;

forming a metal plate and a capacitor lower electrode in each of the vias; and etching the nitrogen oxide layer, the polysilicon layer, certain portions of the nitride layer and the dielectric layer under the nitride layer in turn, wherein each of capacitor lower electrodes is surrounded and adhered with the silicon dioxide and the nitride layer to increase the supporting force, reduce the difficulty of disposing a capacitor dielectric layer and a capacitor upper electrode onto the capacitor lower electrode, and prevent toppling of the capacitor lower electrode.

2. The process using oxide supporter for manufacturing a capacitor lower electrode of a micron stacked DRAM as claimed in claim 1, wherein during partially etching the photoresist layer and the upper oxide layer, the photoresist layer and the upper oxide layer in an array area are etched first, and then the photoresist layer in a peripheral area is etched.

3. The process using oxide supporter for manufacturing a capacitor lower electrode of a micron stacked DRAM as claimed in claim 1, wherein before depositing a nitrogen oxide layer on the polysilicon layer and the upper oxide layer, further comprises polishing the polysilicon layer by chemical mechanical polishing to make it and the upper oxide layer have the same level.

4. The process using oxide supporter for manufacturing a capacitor lower electrode of a micron stacked DRAM as claimed in claim 1, wherein during forming the vias, the vias are located via a photolithography process and a plasma etching process.

5. The process using oxide supporter for manufacturing a capacitor lower electrode of a micron stacked DRAM as claimed in claim 1, wherein during oxidizing the polysilicon layer, the silicon dioxides are formed via an annealing process.

6. The process using oxide supporter for manufacturing a capacitor lower electrode of a micron stacked DRAM as claimed in claim 1, wherein during etching the nitride layer, the dielectric layer and the lower oxide layer under the vias, the nitride layer, the dielectric layer and the lower oxide layer out of the vias are reserved.

7. The process using oxide supporter for manufacturing a capacitor lower electrode of a micron stacked DRAM as claimed in claim 1, wherein before etching the dielectric layer under the nitride layer, further comprises forming a moat in the peripheral area to prevent from etching.

8. A process using oxide supporter for manufacturing a capacitor lower electrode of a micron stacked DRAM, comprising:
  forming a stacked structure, wherein the stacked structure includes an upper oxide layer, a lower oxide layer, a dielectric layer, and a nitride layer, the dielectric layer and the nitride layer are between the upper oxide layer and the lower oxide layer, the nitride layer is on the dielectric layer;
  forming a photoresist layer on the upper oxide layer, partially etching the photoresist layer and the upper oxide layer;
  depositing a polysilicon layer on the upper oxide layer and the nitride layer;
  depositing a nitrogen oxide layer on the polysilicon layer and the upper oxide layer;
  partially etching the nitrogen oxide layer, the polysilicon layer and the upper oxide layer to form a plurality of vias;
  oxidizing the polysilicon layer converting the polysilicon layer to silicon dioxide surrounding the vias;
  etching the nitride layer, the dielectric layer and the lower oxide layer beneath the vias;
  forming a capacitor lower electrode in each of the vias; and
  etching the nitrogen oxide layer, the polysilicon layer, certain portions of the nitride layer and the dielectric layer beneath the nitride layer in turn, wherein each of capacitor lower electrodes is surrounded and adhered with the silicon dioxide and the nitride layer to increase the supporting force, the difficulty of disposing a capacitor dielectric layer and a capacitor upper electrode onto the capacitor lower electrode is improved, and prevent toppling of the capacitor lower electrode.

9. The process using oxide supporter for manufacturing a capacitor lower electrode of a micron stacked DRAM as claimed in claim 8, wherein during partially etching the photoresist layer and the upper oxide layer, the photoresist layer and the upper oxide layer in an array area are etched first, and then the photoresist layer in a peripheral area is etched.

10. The process using oxide supporter for manufacturing a capacitor lower electrode of a micron stacked DRAM as claimed in claim 8, wherein before depositing a nitrogen oxide layer on the polysilicon layer and the upper oxide layer, further comprises polishing the polysilicon layer by chemical mechanical polishing to make it and the upper oxide layer have the same level.

11. The process using oxide supporter for manufacturing a capacitor lower electrode of a micron stacked DRAM as claimed in claim 8, wherein during forming the vias, the vias are located via a photolithography process and a plasma etching process.

12. The process using oxide supporter for manufacturing a capacitor lower electrode of a micron stacked DRAM as claimed in claim 8, wherein during oxidizing the polysilicon layer, the silicon dioxides are formed via an annealing process.

13. The process using oxide supporter for manufacturing a capacitor lower electrode of a micron stacked DRAM as claimed in claim 8, wherein during etching the nitride layer, the dielectric layer and the lower oxide layer beneath the vias, the nitride layer, the dielectric layer and the lower oxide layer out of the vias are reserved.

14. The process using oxide supporter for manufacturing a capacitor lower electrode of a micron stacked DRAM as claimed in claim 8, wherein before etching the dielectric layer beneath the nitride layer, further comprises forming a moat in the peripheral area to prevent from etching.

\* \* \* \* \*